(12) United States Patent
Suzuki

(10) Patent No.: US 8,903,529 B2
(45) Date of Patent: Dec. 2, 2014

(54) SIMULATION METHOD, SIMULATION APPARATUS, AND COMPUTER-READABLE STORAGE MEDIUM

(75) Inventor: Tatsuya Suzuki, Tokyo (JP)

(73) Assignee: Olympus Corporation, Tokyo (JP)

( * ) Notice: Subject to any disclaimer, the term of this patent is extended or adjusted under 35 U.S.C. 154(b) by 720 days.

(21) Appl. No.: 13/249,776

(22) Filed: Sep. 30, 2011

(65) Prior Publication Data

US 2012/0022677 A1    Jan. 26, 2012

Related U.S. Application Data

(63) Continuation of application No. PCT/JP2010/056007, filed on Apr. 1, 2010.

(30) Foreign Application Priority Data

Apr. 2, 2009  (JP) ................................. 2009-090405
Jan. 13, 2010  (JP) ................................. 2010-005337

(51) Int. Cl.
| | | |
|---|---|---|
| G06F 19/00 | (2011.01) | |
| G06F 17/50 | (2006.01) | |
| B27M 1/02 | (2006.01) | |
| B27D 3/00 | (2006.01) | |
| B27M 1/08 | (2006.01) | |
| B27G 1/00 | (2006.01) | |

(52) U.S. Cl.
CPC .. *B27M 1/02* (2013.01); *B27D 3/00* (2013.01); *B27G 1/00* (2013.01); *B27M 1/08* (2013.01); *G06F 17/5009* (2013.01)
USPC .............................. 700/98; 144/24.14; 703/1

(58) Field of Classification Search
CPC . G06Q 40/06; G06Q 10/067; G06Q 10/1057; G06Q 40/00; G06Q 40/04; G06T 11/203; G06T 17/20; G06T 11/003; G06T 17/00; G06T 17/10; G06T 2207/10096; G06T 2207/10116; G06T 2207/20064; G06T 2207/30
See application file for complete search history.

(56) References Cited

U.S. PATENT DOCUMENTS 4,002,193 A *   1/1977   Schmidt ............................ 142/7
4,127,686 A *  11/1978   Motai ............................ 427/351
(Continued)

FOREIGN PATENT DOCUMENTS

| JP | 11-077619 A | 3/1999 |
|---|---|---|
| JP | 3078452 B2 | 6/2000 |
| JP | 4129270 B2 | 5/2008 |
| JP | 41292270 B2 | 8/2008 |

OTHER PUBLICATIONS

Andrew et al., "Modeling Knot Geometry in Norway Source from Industrial CT Images", Springer-Verlag, 2003, pp. 786-791.*

(Continued)

Primary Examiner — Kavita Padmanabhan
Assistant Examiner — Thomas Stevens
(74) Attorney, Agent, or Firm — Hogan Lovells US LLP

(57) ABSTRACT

A simulation apparatus includes a storing unit that stores therein information about a shape of a blank piece to be cut out from raw wood, information about a final shape of a wooden piece obtained by compressing the blank piece, and image data of a surface of the blank piece. The apparatus also includes detecting unit that detects a knot appearing on the surface of the blank piece by image recognition using the image data; a shape estimating unit that estimates a shape of the detected knot using shape information on the blank piece; and a determining unit that determines, in accordance with the shape of the estimated knot, a cutting location and a cutting shape of the blank piece in such a manner that the cutting location and shape include a part and a thickness of the knot is substantially the same as that of the compressed blank piece.

23 Claims, 25 Drawing Sheets

(56) References Cited

U.S. PATENT DOCUMENTS

| | | | |
|---|---|---|---|
| 4,221,974 A | 9/1980 | Mueller et al. | |
| 5,960,104 A * | 9/1999 | Conners et al. | 382/141 |
| 6,272,437 B1 | 8/2001 | Woods et al. | |
| 7,670,531 B2 * | 3/2010 | Suzuki et al. | 264/296 |
| 2006/0074917 A1 * | 4/2006 | Chand et al. | 707/10 |

OTHER PUBLICATIONS

English translation of Decision of a Patent Grant, date mailed Apr. 2, 2013; Japanese Application No. 2010-005337; Issuing Date: Mar. 28, 2013, 3 pages.

* cited by examiner

SIMULATION METHOD, SIMULATION APPARATUS, AND COMPUTER-READABLE STORAGE MEDIUM

CROSS REFERENCES TO RELATED APPLICATIONS

This application is a continuation of PCT international application Ser. No. PCT/JP2010/056007 filed on Apr. 1, 2010 which designates the United States, incorporated herein by reference, and which claims the benefit of priority from Japanese Patent Application No. 2009-090405, filed on Apr. 2, 2009, and Japanese Patent Application No. 2010-005337, filed on Jan. 13, 2010, incorporated herein by reference.

BACKGROUND OF THE INVENTION

1. Field of the Invention

The present invention relates to a simulation method, a simulation apparatus, and a computer-readable storage medium for selecting, performed as a simulation, a location on a piece of wood that requires cutting before being formed by compression.

2. Description of the Related Art

In recent years, wooden materials that are natural materials attract attention. With a wide variety of grain patterns, wood products made of wood exhibit individual features depending on positions of the raw wood from which the particular wood products are cut out. Such individual features of each wood product give it a unique quality. In addition, surface flaws and discolorations caused by a long-term use create unique textures which tend to evoke warm and familiar feeling in the user. Thus, the wooden material attracts attention as a material for products of uniqueness and taste which cannot be found in products made of synthetic resin or light metals. Techniques for molding wooden materials are also developing dramatically.

According to one conventionally known technique for molding wooden materials: a wooden board is softened with water absorption and compressed; the compressed wooden board is cut along a direction substantially parallel with a direction in which the compressive force is applied, whereby a primary fixed product with a sheet-like shape is obtained; and the primary fixed product is deformed into a desired three-dimensional shape under heat and moisture (for example, see Japanese Patent No. 3078452). Further, according to another conventional technique, a softened wooden sheet is compressed and temporarily secured in a prepared mold and left in the mold until the wooden sheet recovers. Thus a wood product with a desired shape can be obtained (see, for example, Japanese Laid-open Patent Publication No. 11-077619).

SUMMARY OF THE INVENTION

A simulation method according to an aspect of the present invention is of selecting a location on a wooden piece to be cut before the wooden piece is compressed, the selecting being performed as a simulation by a computer. The simulation method includes reading the image data stored in a storing unit of the computer and detecting a knot appearing on a surface of a blank piece by performing image recognition using the read image data, the storing unit storing therein information related to a shape of the blank piece to be cut put from raw wood, information related to a final shape of the wooden piece obtained by compressing the blank piece, and image data obtained by capturing an image of the surface of the blank piece cut put from the raw wood; estimating, if a knot is detected at the detecting, a shape of the knot by referring to shape information on the blank piece stored in the storing unit; and determining, in accordance with the shape of the knot estimated at the estimating, a cutting location and a cutting shape of the blank piece in such a manner that the cutting location and the cutting shape include a part of the knot and a thickness of the knot is substantially the same as that of the blank piece that has been compressed.

A simulation apparatus according to another aspect of the present invention includes a storing unit that stores therein information related to a shape of a blank piece to be cut out from raw wood, information related to a final shape of a wooden piece obtained by compressing the blank piece, and image data obtained by capturing an image of a surface of the blank piece cut out from the raw wood; a knot detecting unit that reads the image data stored in the storing unit and that detects a knot appearing on the surface of the blank piece by performing image recognition using the read image data; a knot shape estimating unit that estimates a shape of the knot detected by the knot detecting unit by referring to shape information on the blank piece stored in the storing unit; and a cutting mode determining unit that determines, in accordance with the shape of the knot estimated by the knot shape estimating unit, a cutting location and a cutting shape of the blank piece in such a manner that the cutting location and the cutting shape include a part of the knot and a thickness of the knot is substantially the same as that of the blank piece that has been compressed.

A non-transitory computer-readable storage medium according to still another aspect of the present invention has an executable program stored thereon. The program is for selecting a location on a wooden piece to be cut before the wooden piece is compressed and instructs a processor to perform reading the image data stored in a storing unit and detecting a knot appearing on a surface of a blank piece by performing image recognition using the read image data, the storing unit storing therein information related to a shape of the blank piece to be cut put from raw wood, information related to a final shape of the wooden piece obtained by compressing the blank piece, and image data obtained by capturing an image of the surface of the blank piece cut put from the raw wood; estimating, if a knot is detected at the detecting, a shape of the knot by referring to shape information on the blank piece stored in the storing unit; and determining, in accordance with the shape of the knot estimated at the estimating, a cutting location and a cutting shape of the blank piece in such a manner that the cutting location and the cutting shape include a part of the knot and a thickness of the knot is substantially the same as that of the blank piece that has been compressed.

The above and other features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

In the following, preferred embodiments of the present invention will be described. The drawings used for the descriptions below is only schematically illustrated. The size or reduction in scale of elements may sometimes differ between the drawings.

First Embodiment

Figure 1:
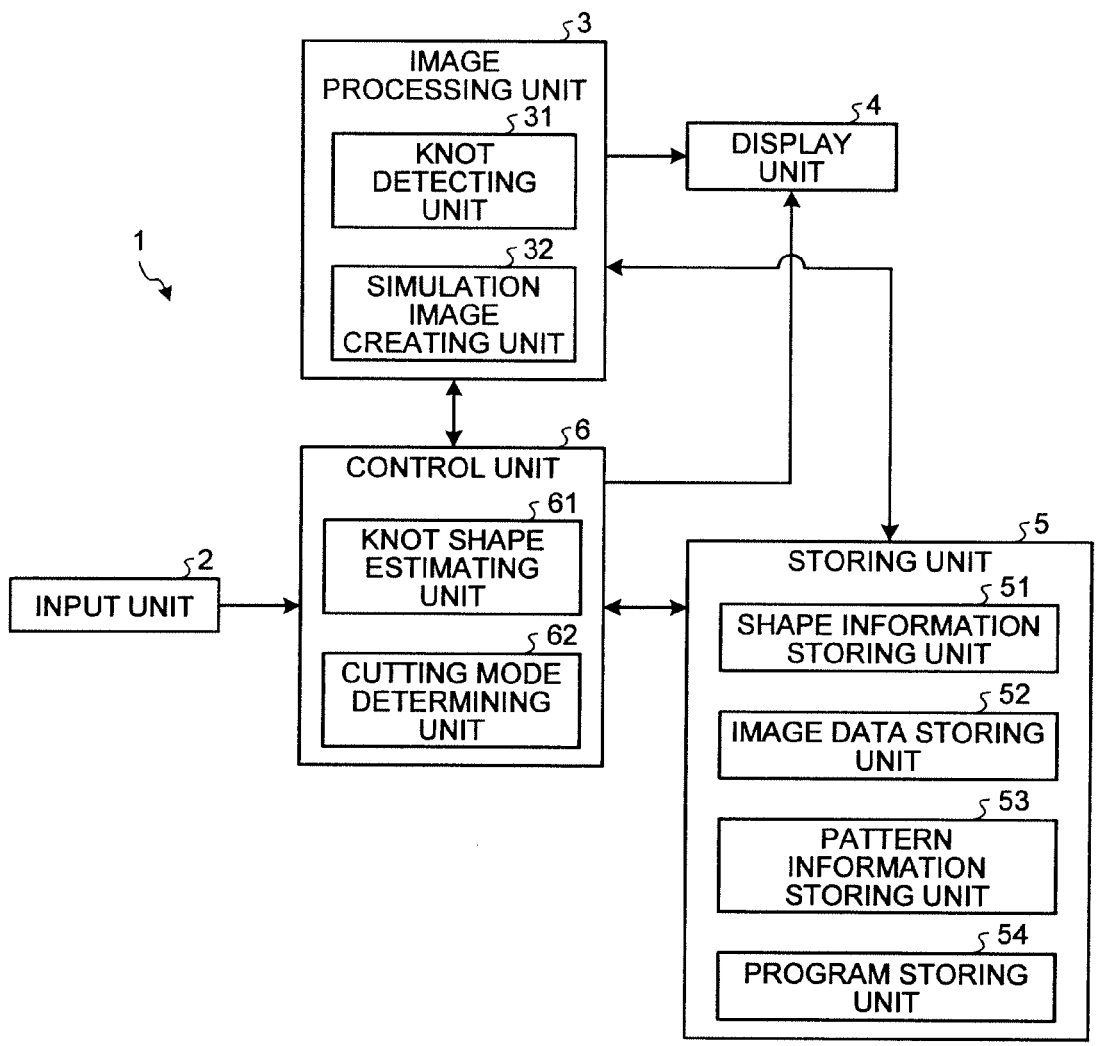
FIG. 1 is a functional block diagram illustrating the configuration of a simulation apparatus according to a first embodiment of the present invention.

FIG. 1 is a block diagram illustrating the configuration of a simulation apparatus according to a first embodiment of the present invention. A simulation apparatus 1 illustrated in FIG. 1 is a device that detects whether a knot in a blank piece cut out from raw wood is present and, when a knot is detected, that simulates an image of the location and the shape to be cut in accordance with the location of the knot.

The simulation apparatus 1 includes an input unit 2 that receives an input of information from outside; an image processing unit 3 that performs image processing on image data obtained by capturing an image of the surface of a blank piece; a display unit 4, such as a liquid crystal display, a plasma display, or an organic EL display, that displays various kinds of information including simulation results; a storing unit 5 that stores therein various kinds of information including image data that is referred to by the image processing unit 3; and a control unit 6 that controls the operation of the simulation apparatus 1.

The image processing unit 3 includes a knot detecting unit 31 that detects, using the pattern matching, a knot appearing on the surface of the blank piece and a simulation image creating unit 32 that creates an image by simulation, i.e., a simulation image, that represents the location of the blank piece that is to be cut (hereinafter, "cutting location") and the shape into which it is to be cut (hereinafter, "cutting shape").

The storing unit 5 includes a shape information storing unit 51 that stores therein information related to the shape of the blank piece that is previously set and information related to the shape of the compressed blank piece; an image data storing unit 52 that stores therein image data obtained by capturing an image of the surface of the blank piece that is cut out from raw wood; a pattern information storing unit 53 that stores therein a pattern of a knot to which the knot detecting unit 31 refers when performing the pattern matching; and a program storing unit 54 that stores therein various programs including a simulation program according to the first embodiment of the present invention. The storing unit 5 is implemented by using a semiconductor memory, such as a flash memory or a RAM, that is securely arranged inside the simulation apparatus 1. In addition to recording information in a storage medium, such as a memory card, that is installed from outside, the storing unit 5 can also function as a storage medium interface that reads information recorded in the storage medium. It is possible to make use of the simulation program according to the first embodiment more widely available by recoding it in a computer-readable storage medium, such as a hard disk, a flexible disk, a CD-ROM, and the like.

The control unit 6 includes a knot shape estimating unit 61 that estimates, by referring to the shape information on the blank piece stored in the shape information storing unit 51, the internal shape of the blank piece of the knot detected by the knot detecting unit 31. The control unit 6 also includes a cutting mode determining unit 62 that determines the cutting location and the cutting shape of the blank piece in accordance with the shape of the knot estimated by the knot shape estimating unit 61. The control unit 6 is implemented using, for example, a micro processing unit (MPU) and is connected to, via a bus line, each of the units to be controlled in the simulation apparatus 1.

The simulation apparatus 1 having such configuration is implemented by one or a plurality of computers. When the simulation apparatus 1 is implemented using a plurality of computers, in addition to a case in which computers are directly connected to each other and function as at least a part of the simulation apparatus 1, a case is also included in which the computers are connected each other using an appropriate communication line, such as the Internet, a dedicated network, a telephone network, and the like.

Figure 2:
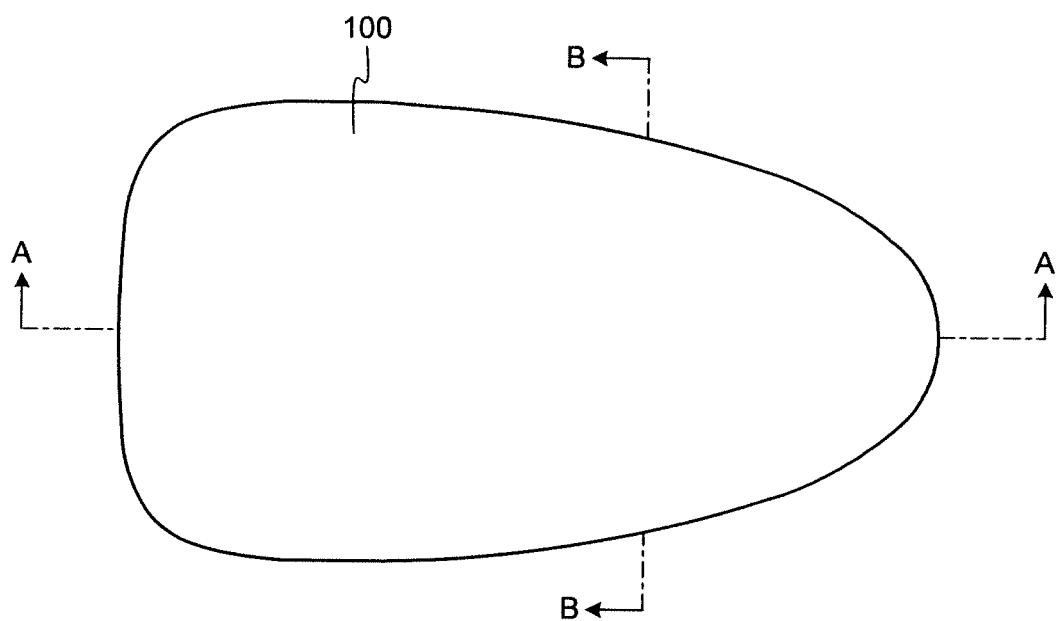
FIG. 2 is a plan view illustrating the shape of a blank piece stored by a shape information storing unit in the simulation apparatus according to the first embodiment of the present invention.
Figure 3:
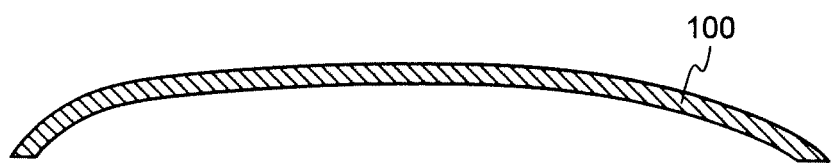
FIG. 3 is a sectional view taken along line A-A of FIG. 2.
Figure 4:
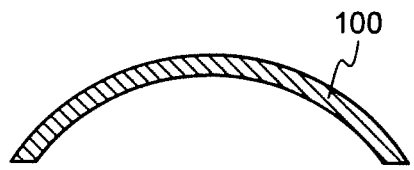
FIG. 4 is a sectional view taken along line B-B of FIG. 2.

FIG. 2 is a plan view illustrating the shape of a blank piece stored by the shape information storing unit 51. FIG. 3 is a sectional view taken along line A-A of FIG. 2. FIG. 4 is a sectional view taken along line B-B of FIG. 2. A blank piece 100 illustrated in FIGS. 2 to 4 has substantially a bowl shape and has a volume to which a reduced volume due to the compression forming is previously added. In the blank piece 100, a sectional view parallel to the sectional view taken along line A-A is substantially similar to the shape illustrated in FIG. 3. In contrast, a sectional view parallel to the sectional view taken along line B-B is substantially similar to the shape illustrated in FIG. 4. The raw material of the blank piece 100 can be appropriately selected from materials including, in accordance with various conditions including purposes after the compression forming, Japanese cypress, hiba cedar, paulownia, Japanese cedar, pine, cherry, zelkova, ebony wood, red sandalwood, bamboo, teak, mahogany, rosewood, and the like.

Figure 5:
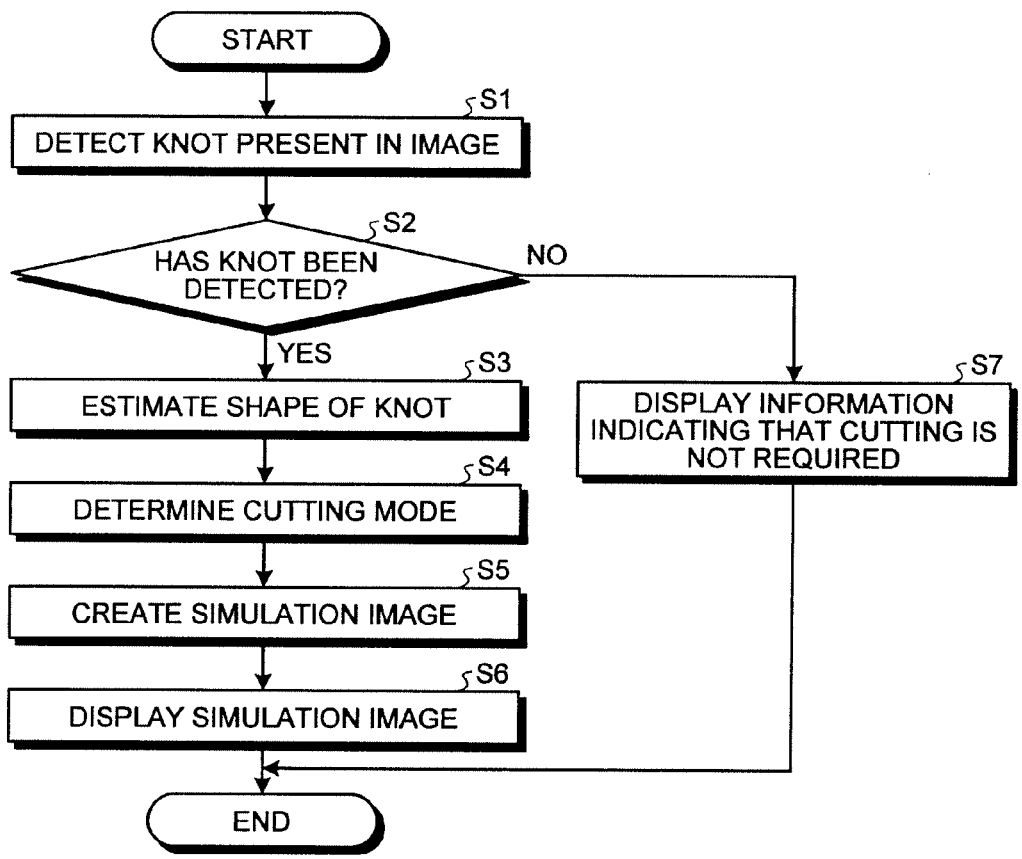
FIG. 5 is a flowchart illustrating the flow of a process of a simulation method according to the first embodiment of the present invention.

FIG. 5 is a flowchart illustrating the flow of a process of a simulation method according to the first embodiment of the present invention. In FIG. 5, first, the knot detecting unit 31 reads, from the image data storing unit 52, image data of the surface of a shaped blank piece and detects a knot that is present on the surface of the blank piece (Step S1). Specifically, the knot detecting unit 31 reads the image data of the surface of the blank piece from the image data storing unit 52; reads the pattern of the knot stored in the pattern information storing unit 53; and determines, using the pattern matching, whether a knot that matches the pattern of the read knot is present in the image data.

Figure 6:
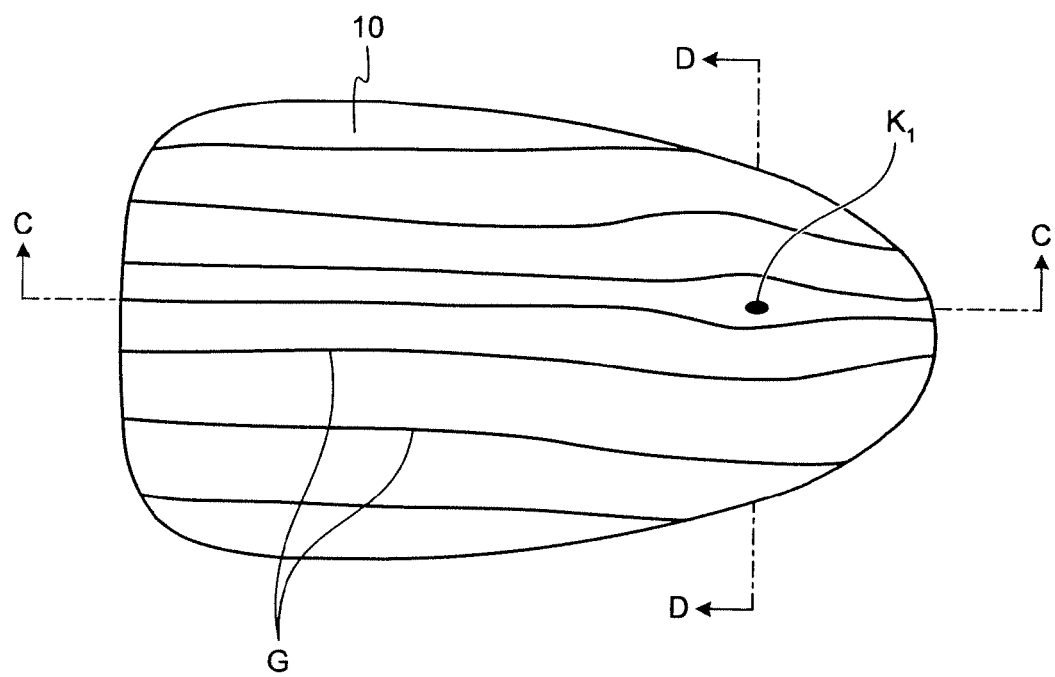
FIG. 6 is a schematic diagram illustrating an example of image data of an outer surface of the blank piece displayed using a simulation method according to the first embodiment of the present invention.
Figure 7:
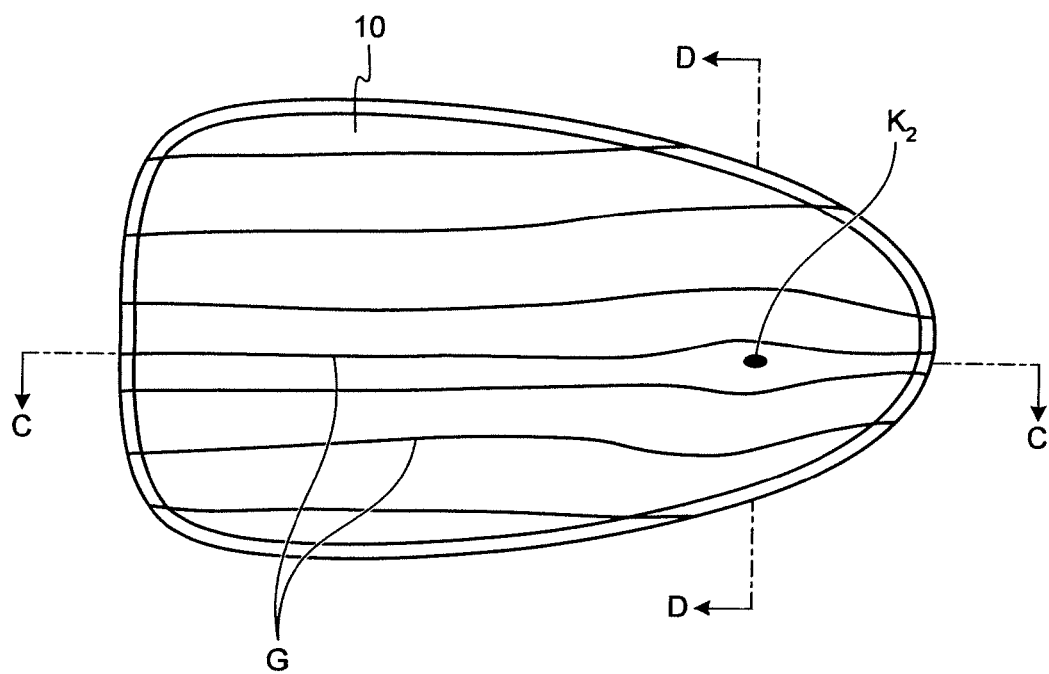
FIG. 7 is a schematic diagram illustrating an example of image data of an inner surface of the blank piece displayed using the simulation method according to the first embodiment of the present invention.

FIGS. 6 and 7 are schematic diagrams each illustrating an example of an image corresponding to image data of a surface of the blank piece. The image data illustrated in FIGS. 6 and 7 is created by image capturing, by an imaging device such as a digital camera, an outer surface and an inner surface of a blank piece 10 cut out from the raw wood so as to have the same shape as that of the blank piece 100. Specifically, FIG. 6 illustrates the outer surface of the image data, whereas FIG. 7 illustrates the inner surface of the image data. The image data is previously recorded in the image data storing unit 52. The blank piece 10 has a straight grain in which grains G are substantially parallel and has a knot on the surface of the blank piece 10. The knot detecting unit 31 detects a knot $K_1$ in the image data of the outer surface illustrated in FIG. 6. In contrast, the knot detecting unit 31 detects a knot $K_2$ in the image data of the inner surface illustrated in FIG. 7.

Figure 8:
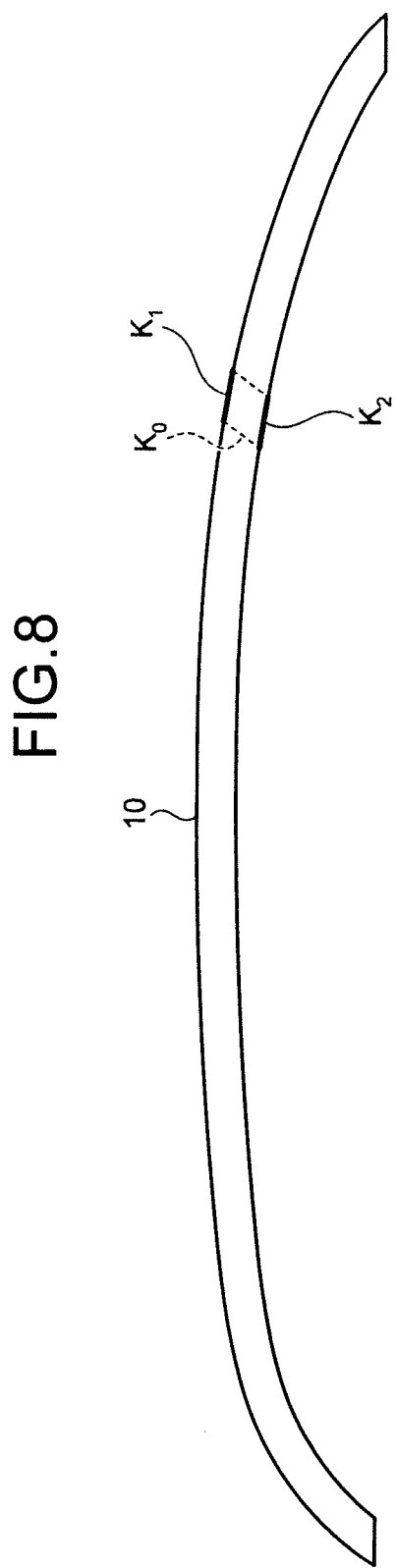
FIG. 8 is a sectional view illustrating the shape of a knot estimated by a knot shape estimating unit in the simulation apparatus according to the first embodiment of the present invention.
Figure 9:
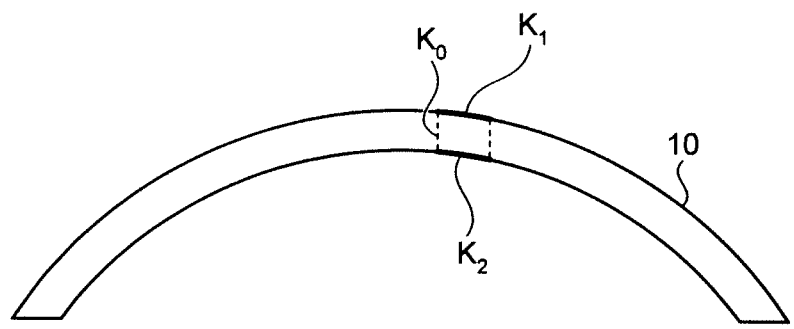
FIG. 9 is a sectional view illustrating the shape of the knot in the direction orthogonal to that illustrated in FIG. 8.

When the knot detecting unit 31 detects a knot (Yes at Step S2), the knot shape estimating unit 61 estimates the shape of the knot (Step S3). FIGS. 8 and 9 are sectional views each illustrating the shape of the knot estimated by the knot shape estimating unit 61. FIG. 8 corresponds to the sectional views taken along line C-C of FIGS. 6 and 7. FIG. 9 corresponds to the sectional views taken along line D-D of FIGS. 6 and 7. The shape of the knot $K_0$ indicated by the broken line in FIGS. 8 and 9 is estimated by the knot shape estimating unit 61 extrapolating in accordance with the knots $K_1$ and $K_2$ and is columnar penetrating the blank piece 10 in the thickness direction thereof.

Subsequently, in accordance with the estimation results estimated by the knot shape estimating unit 61, the cutting mode determining unit 62 determines the cutting location and the cutting shape of the blank piece 10 to be cut (Step S4). At this time, the cutting mode determining unit 62 determines the cutting location and the cutting shape in such a manner that the cutting location includes at least a part of the knot and that the thickness of the knot is substantially the same as that of the compressed blank piece 10.

Figure 10:
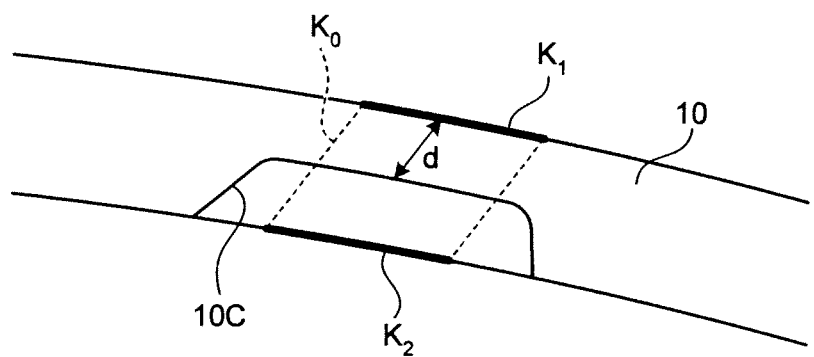
FIG. 10 is a sectional view illustrating a part of the cutting shape determined by a cutting mode determining unit in the simulation apparatus according to the first embodiment of the present invention.
Figure 11:
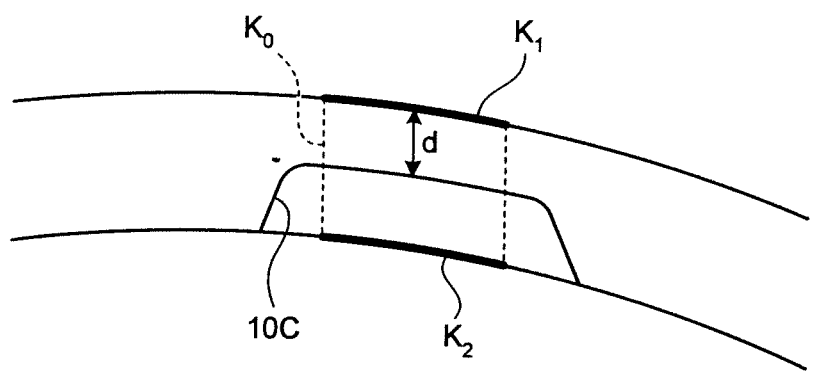
FIG. 11 is a sectional view illustrating the cutting shape in the direction orthogonal to that illustrated in FIG. 10.

FIGS. 10 and 11 are schematic diagrams each illustrating the cutting shape determined by the cutting mode determining unit 62. The cutting surfaces illustrated in FIGS. 10 and 11 correspond to those illustrated in FIGS. 8 and 9, respectively. As illustrated in FIGS. 10 and 11, the cutting shape determined by each cutting surface 10C has a concave shape that includes a bottom surface having the cross section of the knot $K_0$ estimated by the knot shape estimating unit 61 and that has an opening whose area is greater than that of the bottom surface. A columnar region, which extends in the thickness direction of the blank piece 10 from the edge of the bottom surface as the outer edge of the columnar region, does not intersect with the cutting surface 10C other than the bottom surface. The thickness d of the knot $K_0$, which is a thickness other than that of the cutting location, is set to a value substantially the same as the thickness of the compressed blank piece 10.

The characteristics of the cutting shape described above are common characteristics and have to be satisfied regardless of the cutting location. By using such a cutting shape, when performing the compression forming on the blank piece 10, there is hardly any chance of flowing the component of the blank piece 10 other than the knot $K_0$ in the thickness direction of the knot $K_0$. Accordingly, when compressing the blank piece 10, it is possible to prevent the occurrence of a failure, such as cracking or buckling, caused by an excessive compressive force being applied to the knot $K_0$. Furthermore, because the cutting surface is determined in such a manner that only the inner surface of the blank piece 10 is cut, the thickness of the cutting location can be easily adjusted, and moreover, the external appearance of the outer surface is not affected.

After Step S4, the simulation image creating unit 32 creates a simulation image indicating the cutting location and the cutting shape determined by the cutting mode determining unit 62 (Step S5). Then, the display unit 4 displays the created simulation image (Step S6).

Figure 12:
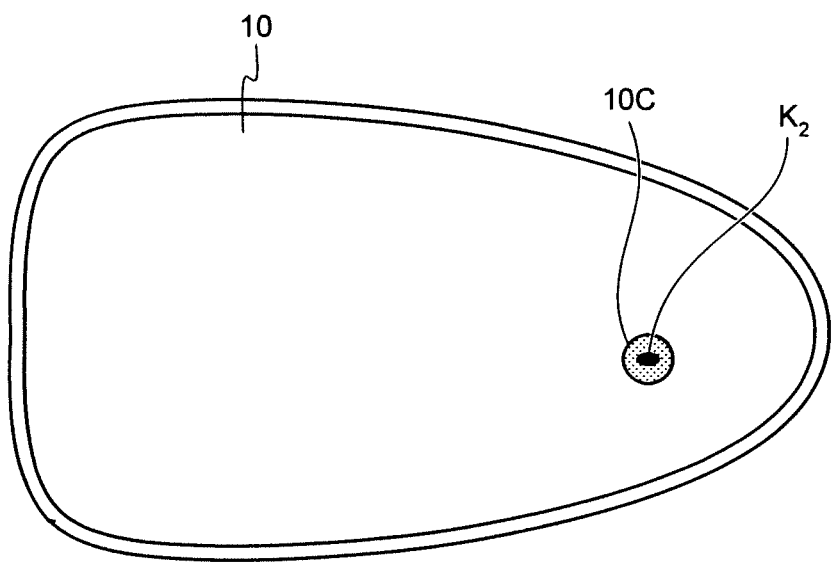
FIG. 12 is a schematic diagram illustrating an example of a simulation image of an inner surface of the blank piece displayed using the simulation method according to the first embodiment of the present invention.
Figure 13:
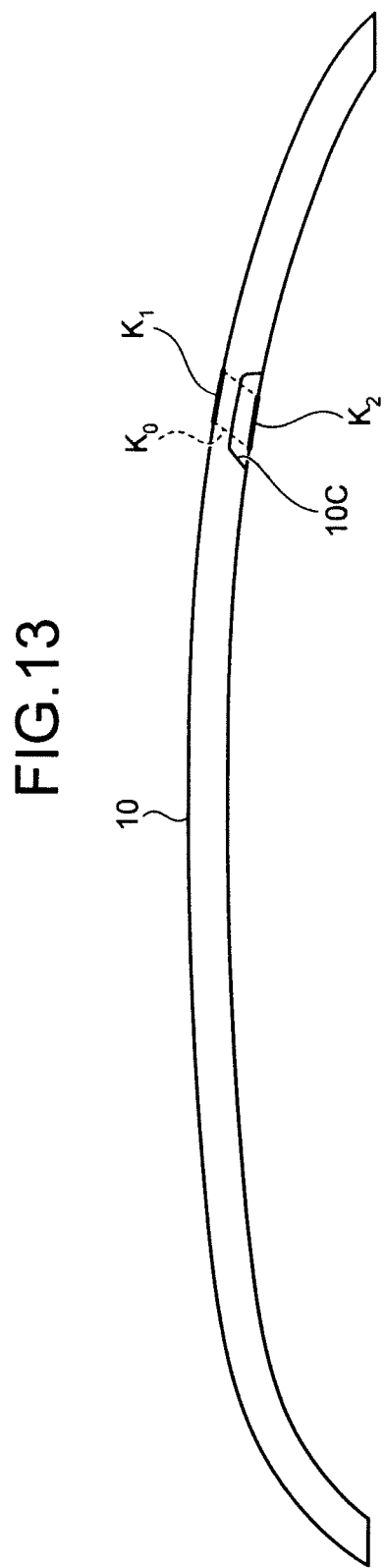
FIG. 13 is a schematic diagram illustrating an example of a simulation image of the cross section of the blank piece displayed using the simulation method according to the first embodiment of the present invention.
Figure 14:
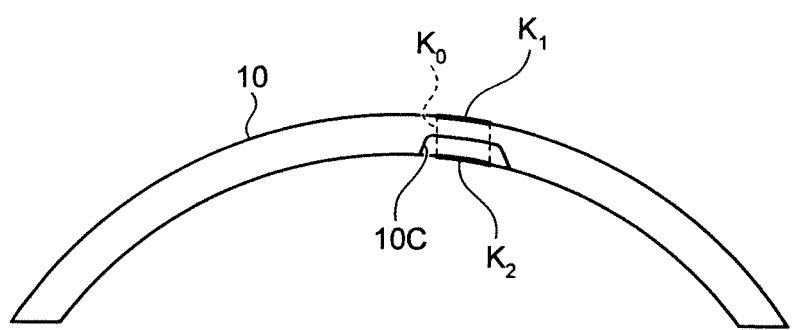
FIG. 14 is a schematic diagram illustrating an example of a simulation image of the cross section of the blank piece in the direction orthogonal to that illustrated in FIG. 13.

FIGS. 12 to 14 are schematic diagrams each illustrating an example of a simulation image displayed by the display unit 4. FIGS. 12 to 14 correspond to the examples of the simulation images illustrated in FIGS. 7 to 9, respectively. The simulation image creating unit 32 can create a simulation image of any given cut surface. The cut surface can be displayed on the display unit 4 by selecting simulation images using the input unit 2. Furthermore, the display unit 4 can also display an enlarged view of the cutting surface 100 as illustrated in FIGS. 10 and 11.

After displaying the simulation image, the simulation apparatus 1 ends the series of processes. When performing the same process on a plurality of image data, the same process can be performed on other image data by returning to Step S5 after Step S1.

In the above explanation, a case has been described in which the knot detecting unit 31 detects a knot at Step S2 (Yes at Step S2). In contrast, when the knot detecting unit 31 does not detect a knot at Step S2 (No at Step S2), the display unit 4 displays information indicating that the cutting is not required (Step S7). Then, the simulation apparatus 1 ends the series of processes.

In the following, a description will be given of the outline of a method for forming the blank piece 10 in which the cutting state is simulated in a manner described above. First, the cutting device cuts the blank piece 10 in accordance with the simulation results of the cutting state. At this time, if a function available for intercommunication is provided for both the simulation apparatus 1 and the cutting device, it is possible to transmit, to the cutting device, information on the cutting location and the cutting shape determined by the cutting mode determining unit 62. In such a case, in accordance with information on the cutting surface 10C received from the simulation apparatus 1, the cutting device automatically cuts the blank piece 10 that is set at a predetermined position.

Subsequently, the cut blank piece 10 is left for a predetermined period of time in a water vapor atmosphere in which the temperature and the pressure are higher than that of the atmosphere in order to soften the cut blank piece 10, and then a compressive force is applied by sandwiching it between a pair of metal molds. The temperature of the water vapor is about 100 to 170° C. and the pressure thereof is about 0.1 to 0.8 mega pascal (MPa).

Figure 15:
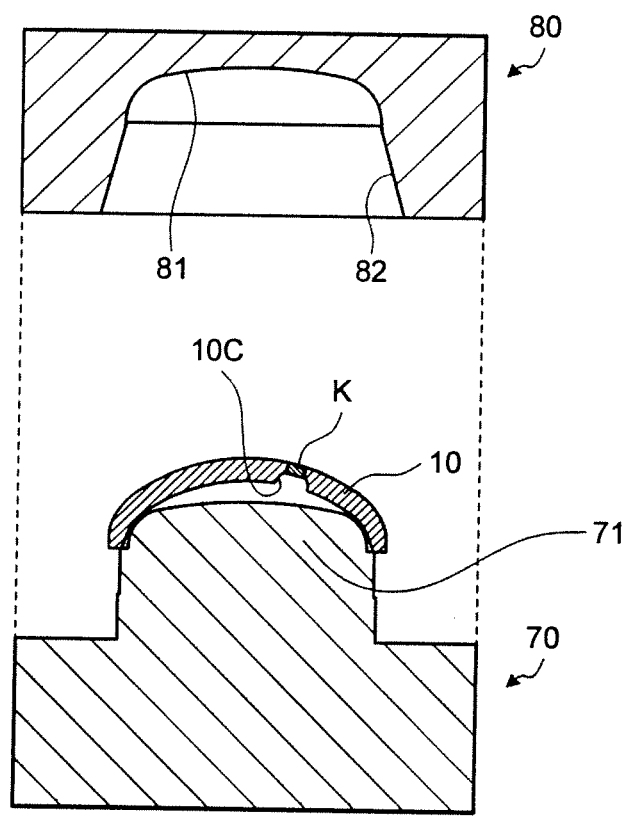
FIG. 15 is a schematic diagram illustrating the outline of a compression process performed on the blank piece and the configuration of a pair of metal molds used in the compression process.
Figure 16:
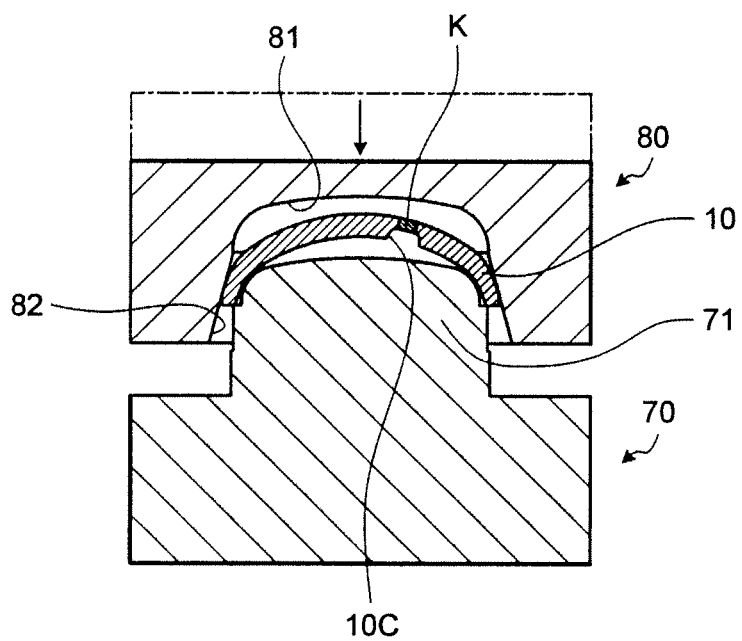
FIG. 16 is a schematic diagram illustrating the state in which, in the compression process on the blank piece, a compressive force is applied to the blank piece by the pair of metal molds.
Figure 17:
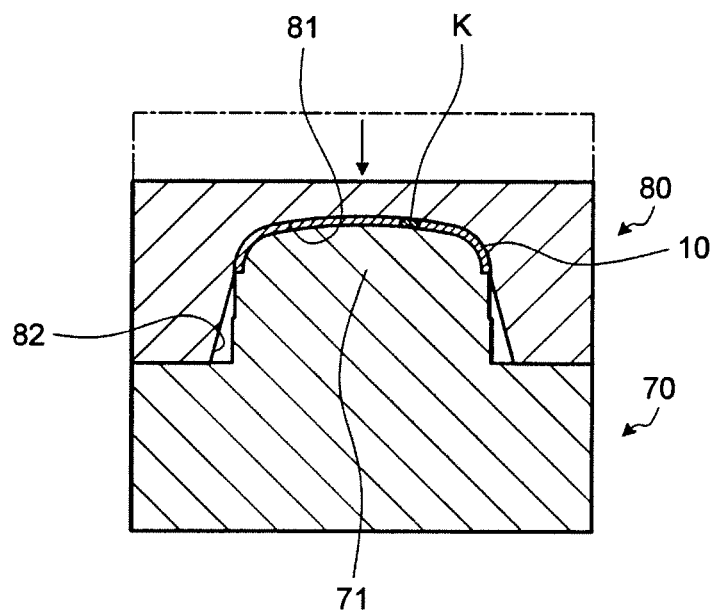
FIG. 17 is a schematic diagram illustrating the state in which, in the compression process on the blank piece, deformation of the blank piece has been completed.

FIGS. 15 to 17 are schematic diagrams each illustrating the outline of a compression process and the configuration of a pair of metal molds used in the compression process. In FIGS. 15 to 17, a real knot in the blank piece 10 is represented by symbol K. A metal mold 70 that is illustrated in FIG. 15 and that applies a compressive force to the blank piece 10 from below is a core metal mold that has a protruding portion 71 protruding to correspond to the shape of a part of the blank piece 10 that has been subjected to the compression molding. In contrast, a metal mold 80 that is illustrated in FIG. 15 and that applies a compressive force to the blank piece 10 from above is a cavity mold that faces the protruding portion 71 of the metal mold 70. The metal mold 80 has a recessed portion 81 that is recessed to correspond to the shape of a part of the wooden piece that has been subjected to compression forming and an inclined portion 82 that smoothly continues into an opening end of the recessed portion 81 and whose cross-sectional area becomes larger in proportion to the distance from the opening end of the recessed portion 81. The curvature of the curved surface of the protruding portion 71 or the recessed portion 81 in cross section is smaller than the curvature of the blank piece 10 in the corresponding cross section.

FIG. 16 is a schematic diagram illustrating the state in which a compressive force begins to be applied to the blank piece 10 by the pair of metal molds 70 and 80 by lowering the metal mold 80 in such a manner that the metal mold 80 is brought closer to the metal mold 70 from the state illustrated in FIG. 15. When further lowering the metal mold 80, the blank piece 10 is gradually deformed due to the compressive force and the blank piece 10 is eventually deformed into a three-dimensional shape that corresponds to a gap between the protruding portion 71 and the recessed portion 81 obtained when the metal mold 80 is lowered to the lowest position (see FIG. 17).

Then, by leaving the blank piece 10 for a predetermined period of time while clamping it using the metal molds 70 and 80 in a water vapor atmosphere in which the temperature and the pressure are higher than that of the above-described water vapor atmosphere, the shape of the blank piece 10 is fixed. The temperature in the water vapor atmosphere at the time of this fixing process is about 160 to 240° C. and the pressure thereof is about 0.6 to 3.4 MPa. Thereafter, by releasing the blank piece 10 and the metal molds 70 and 80 into the atmosphere to dry the blank piece 10, the molding of the blank piece 10 is completed. When performing the drying process on the blank piece 10, the metal mold 70 can be separated from the metal mold 80 in order to dry the blank piece 10 quickly.

In some cases, the size of the dried blank piece 10 may vary in accordance with the type or the shape of the wood. In such a case, by using another pair of hot-forming metal molds other than the metal molds 70 and 80, the dried blank piece 10 can be shaped by heating it in the atmosphere. It is possible to adjust the temperature of the pair of metal molds used in the hot-forming process. The shape of the gap between the metal molds when both metal molds make contact is the final shape of the blank piece.

Figure 18:
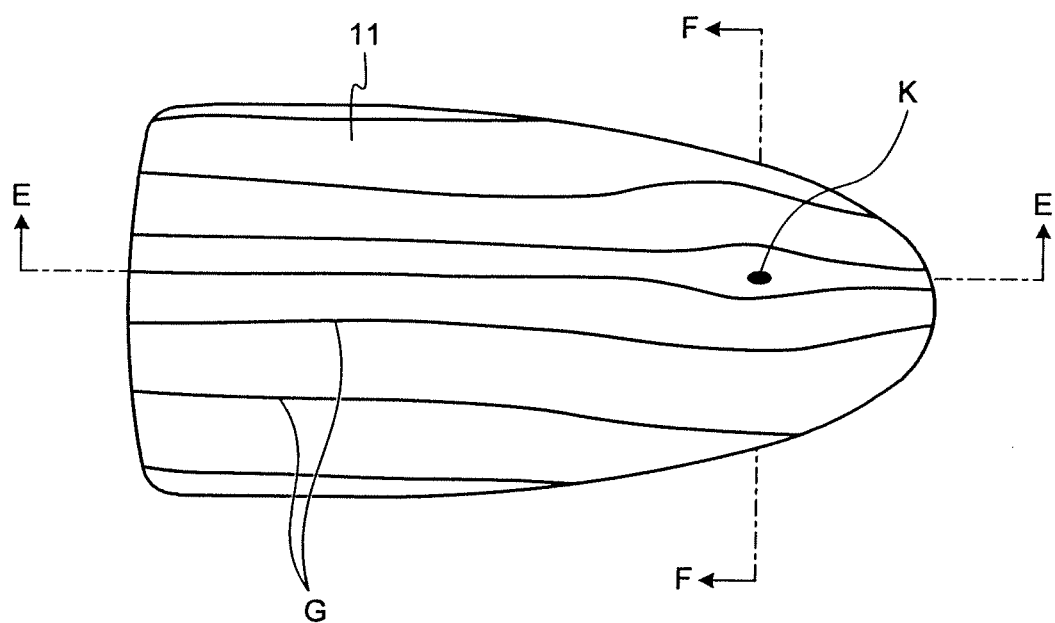
FIG. 18 is a plan view illustrating the configuration of an outer surface of compressed wooden piece obtained by performing the compression forming on the blank piece.
Figure 19:
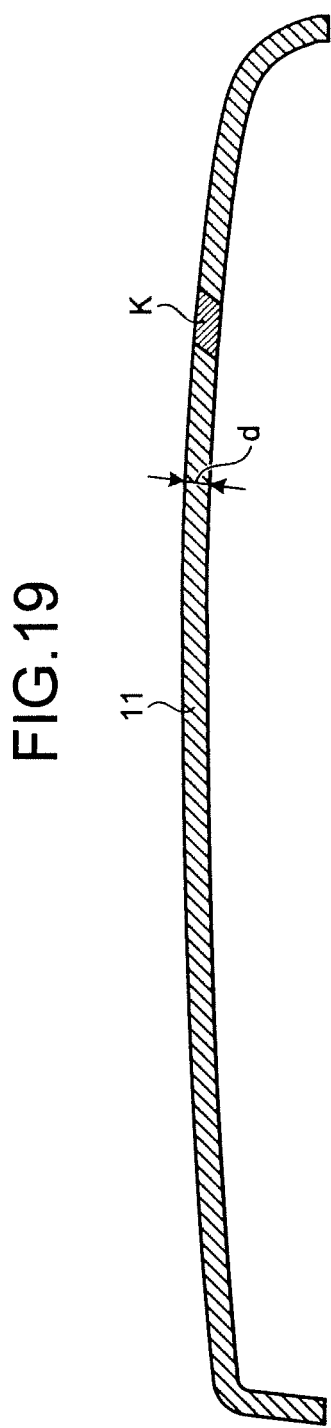
FIG. 19 is a sectional view taken along line E-E of FIG. 18.
Figure 20:
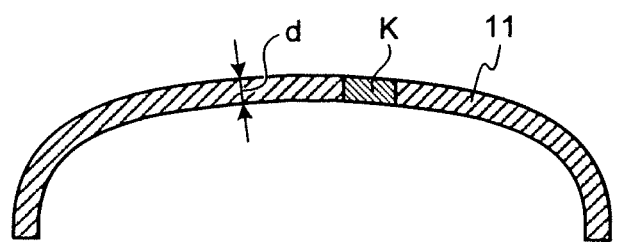
FIG. 20 is a sectional view taken along line F-F of FIG. 18.

FIG. 18 is a plan view illustrating the configuration of an outer surface of compressed wooden piece obtained by performing the compression forming on the blank piece 10. FIG. 19 is a sectional view taken along line E-E of FIG. 18. FIG. 20 is a sectional view taken along line F-F of FIG. 18. Each compressed wooden piece 11 illustrated in FIGS. 18 to 20 has less volume than that of the blank piece 10 and has a more flat-plate shape than the blank piece 10 around the bottom surface. Because the knot K is cut, from the beginning, so as to have substantially the same thickness as that of the compressed wooden piece 11, after the compression, the thickness of the compressed wooden piece 11 becomes the same as that of the neighboring ligneous parts; therefore, the knot K penetrates in the thickness direction of the compressed wooden piece 11.

The thickness d of the compressed wooden piece 11 is preferably about 30% to 50% of that of the blank piece 10. Specifically, the average value of the compressibility (a ratio $\Delta R/R$ that is the ratio of the reduction in thickness $\Delta R$ of the wooden piece caused by compression to the thickness R of the wooden piece before the compression) in the thickness direction of the blank piece 10 in the compression process is preferably about 0.50 to 0.70. However, the knot K is not included in this compressibility.

The density of the compressed wooden piece 11 obtained by using the forming method described above is remarkably greater than that of the blank piece 10. With this compaction, the strength of the compressed wooden piece 11 is tremendously improved when compared with that of the blank piece 10. Even when the knot K is about to come out from the blank piece 10, because the ligneous parts around the knot K are brought into close contact with the knot K, there is no possibility of the knot K coming out from the compressed wooden piece 11.

The compressed wooden piece 11 is used as a part of an outer casing for, for example, an electronic device, such as a digital camera or a mobile phone. In such a case, the thickness of the compressed wooden piece 11 is preferably about 1.0 mm to 1.6 mm.

According to the first embodiment of the present invention, image data stored in the storing unit is read; a knot appearing on the surface of a blank piece is detected by performing image recognition using the read image data; when a knot is detected, the shape of the knot is estimated by referring to shape information on the blank piece stored in the storing unit; and the cutting location and the cutting shape of the blank piece is determined, in accordance with the estimation results, in such a manner that the cutting location and the cutting shape include a part of the knot and that the thickness of the knot is substantially the same as that of the compressed blank piece. Accordingly, when compressing a blank piece that has a knot, it is possible to enhance the cutting of the blank piece in a shape in which a compressive force is hardly applied to the knot of the blank piece. Therefore, it is possible to appropriately perform the compression forming on a wooden piece even when the wooden piece has a knot and to improve yields.

Furthermore, according to the first embodiment of the present invention, because a small knot does not significantly affect the strength, a product having various grain patterns can be produced by performing the compression forming using wood that has such a knot.

Second Embodiment

Figure 21:
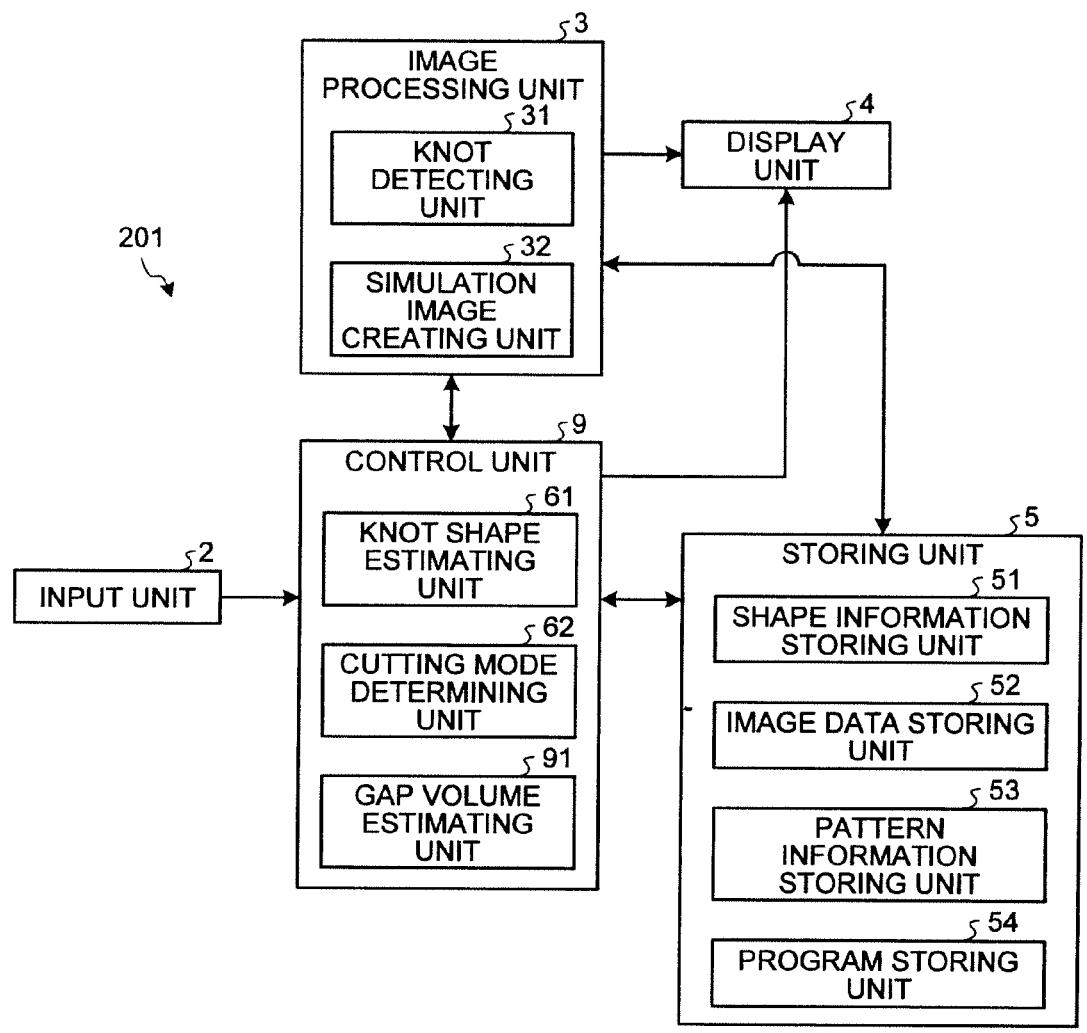
FIG. 21 is a functional block diagram illustrating the configuration of a simulation apparatus according to a second embodiment of the present invention.

FIG. 21 is a functional block diagram illustrating the configuration of a simulation apparatus according to a second embodiment of the present invention. The configuration of the control unit in a simulation apparatus 201 illustrated in FIG. 21 is different from that in the simulation apparatus 1 illustrated in FIG. 1. Specifically, in addition to the knot shape estimating unit 61 and the cutting mode determining unit 62, a control unit 9 in the simulation apparatus 201 includes a gap volume estimating unit 91 that estimates the volume of a gap if a gap is present between a knot and the ligneous parts around the knot. If a knot is a dead knot, the gap is generated between the knot and the ligneous parts. The configuration of the simulation apparatus 201 other than the control unit 9 is the same as that of the simulation apparatus 1.

Figure 22:
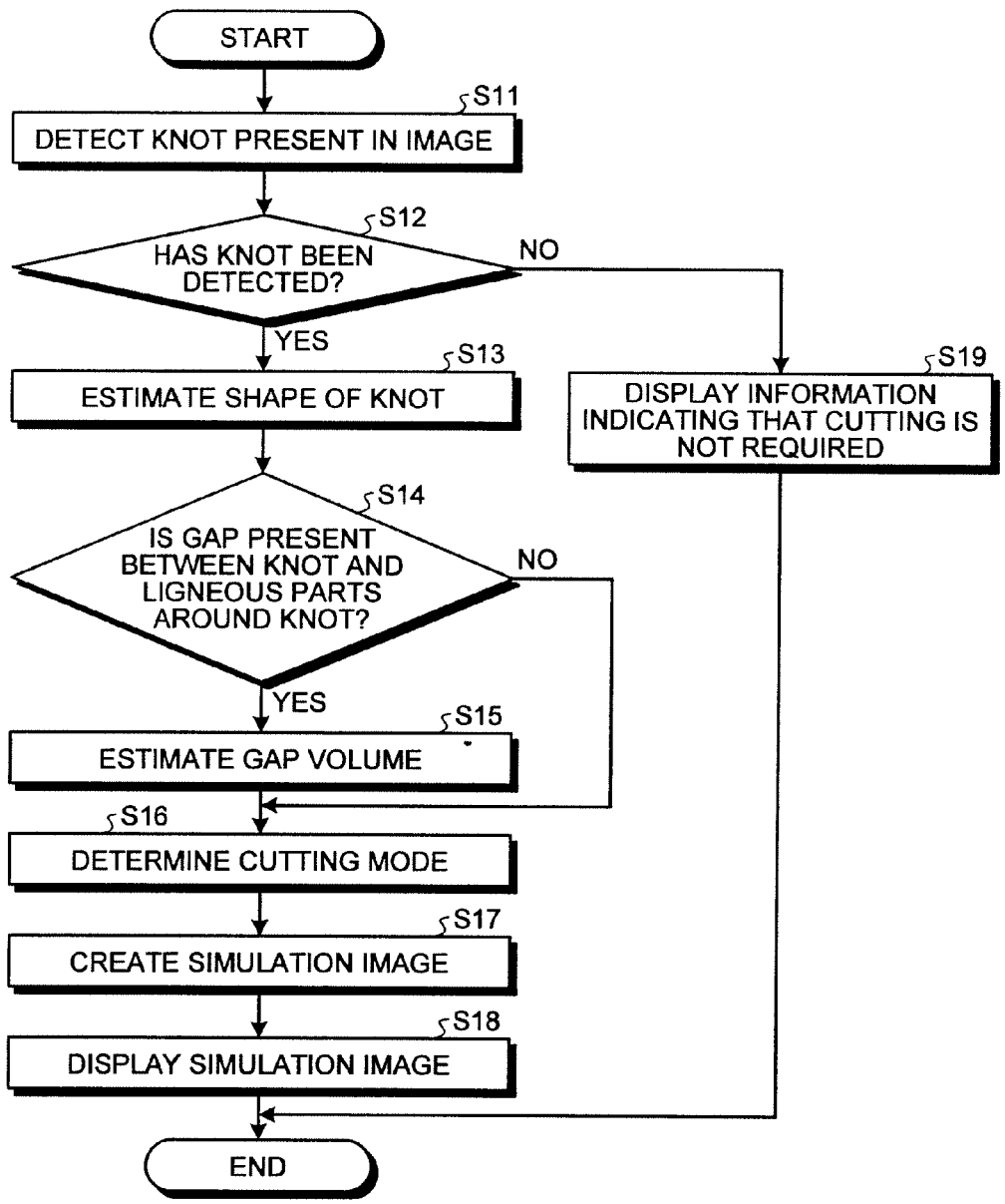
FIG. 22 is a flowchart illustrating the flow of a process of a simulation method according to the second embodiment of the present invention.

FIG. 22 is a flowchart illustrating the flow of a process of a simulation method according to the second embodiment of the present invention. In FIG. 22, first, the knot detecting unit 31 reads, from the image data storing unit 52, image data of the surface of a shaped blank piece and detects a knot that is present on the surface of the blank piece (Step S11). Specifically, the knot detecting unit 31 reads the image data of the surface of the blank piece from the image data storing unit 52; reads the pattern of the knot stored in the pattern information storing unit 53; and determines, using the pattern matching, whether a knot that matches the pattern of the read knot is present in the image data.

Figure 23:
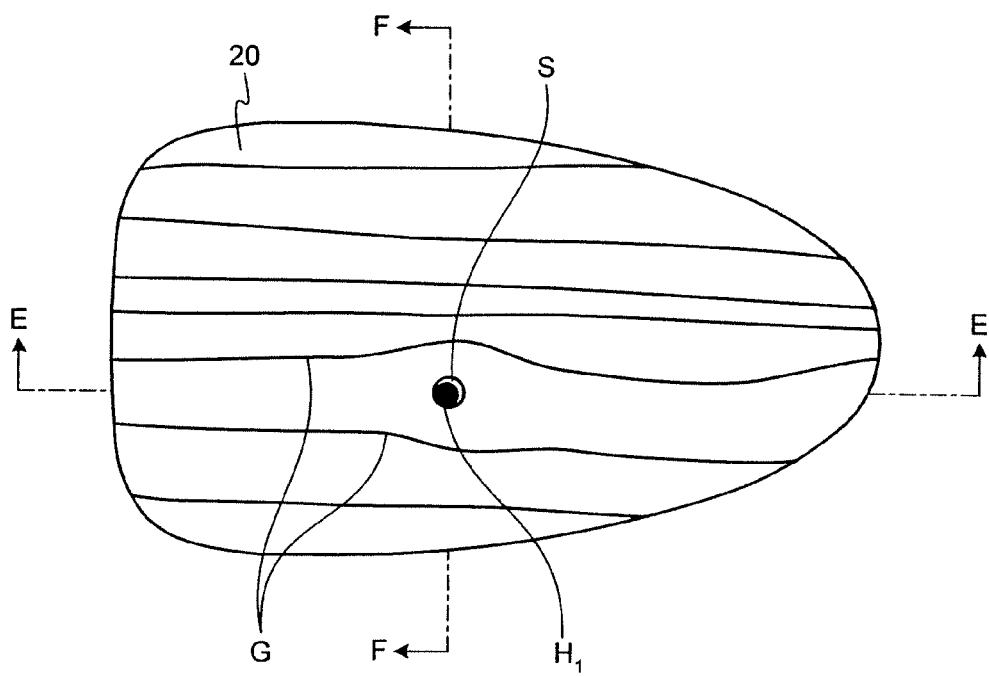
FIG. 23 is a schematic diagram illustrating an example of image data of an outer surface of a blank piece displayed using the simulation method according to the second embodiment of the present invention.
Figure 24:
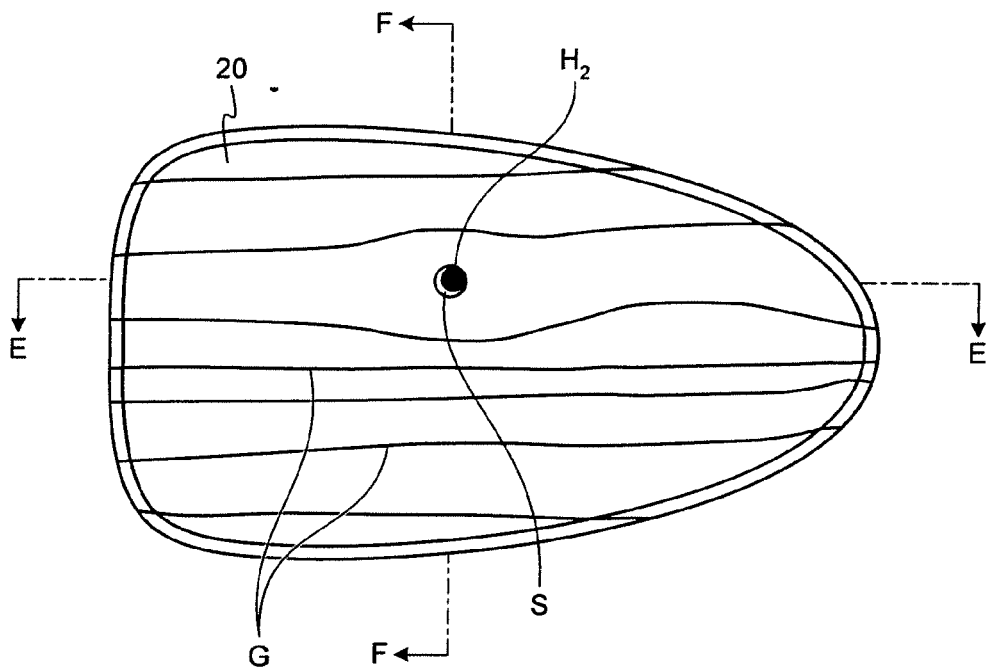
FIG. 24 is a schematic diagram illustrating an example of image data of an inner surface of the blank piece displayed using the simulation method according to the second embodiment of the present invention.

FIGS. 23 and 24 are schematic diagrams each illustrating an example of an image corresponding to image data of the surface of the blank piece. The image data illustrated in FIGS. 23 and 24 is created by image capturing, by an imaging device such as a digital camera, an outer surface and an inner surface of a blank piece 20 cut out from the raw wood so as to have the same shape as that of the blank piece 100 illustrated in FIGS. 2 to 4. Specifically, FIG. 23 illustrates the outer surface of the image data, whereas FIG. 24 illustrates the inner surface of the image data. The image data is previously recorded in the image data storing unit 52. The blank piece 20 has a straight grain in which grains G are substantially parallel and has a knot on the surface of the blank piece 20. The knot detecting unit 31 detects a knot $H_1$ in the image data of the outer surface illustrated in FIG. 23. In contrast, the knot detecting unit 31 detects a knot $H_2$ in the image data of the inner surface illustrated in FIG. 24. A gap S is generated between the knots $H_1$ and $H_2$ and the ligneous parts around the knots $H_1$ and $H_2$. The knot detecting unit 31 can detect this gap S using pattern matching.

Figure 25:
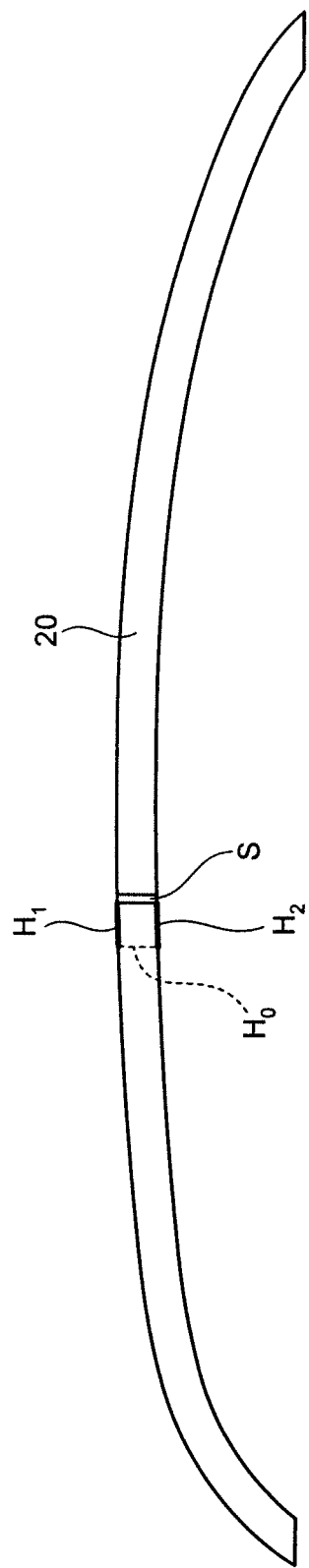
FIG. 25 is a sectional view illustrating the shape of a knot estimated by a knot shape estimating unit in the simulation apparatus according to the second embodiment of the present invention.
Figure 26:
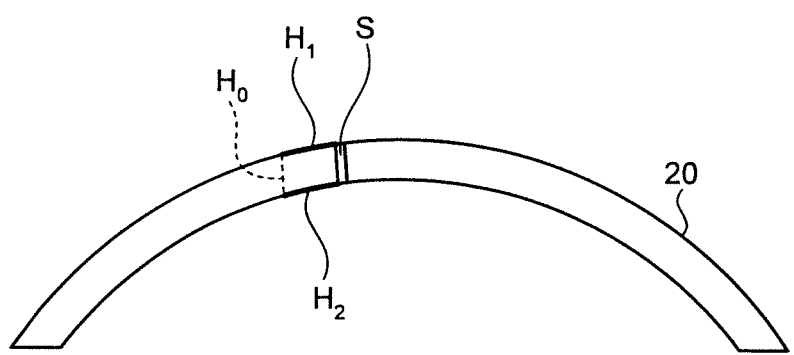
FIG. 26 is a sectional view illustrating the shape of the knot in the direction orthogonal to that illustrated in FIG. 25.

When the knot detecting unit 31 detects a knot (Yes at Step S12), the knot shape estimating unit 61 estimates the shape of the knot (Step S13). FIGS. 25 and 26 are schematic diagrams each illustrating the shape of a knot estimated by the knot shape estimating unit 61. FIG. 25 corresponds to the sectional views taken along line E-E of FIGS. 23 and 24. FIG. 26 corresponds to the sectional views taken along line F-F of FIGS. 23 and 24. The shape of the knot $H_0$ indicated by the broken line in FIGS. 25 and 26 is estimated by the knot shape estimating unit 61 extrapolating in accordance with the knots $H_1$ and $H_2$. The knot shape estimating unit 61 also estimates the shape of the gap S detected between the knots $H_1$ and $H_2$ and the ligneous parts around the knots $H_1$ and $H_2$.

Subsequently, if a gap is present between the knot detected by the knot detecting unit 31 and the ligneous parts (Yes at Step S14), the gap volume estimating unit 91 estimates the volume of the gap by using an extrapolation (Step S15). A "gap is present" mentioned here means that there is a gap that can be recognized by the knot detecting unit 31 using pattern matching. Conversely, if a gap is not present between the knot and the ligneous parts at Step S14 (No at Step S14), the simulation apparatus 201 proceeds to Step S16.

A method other than pattern matching can be used for detecting a gap between the knot detected by the knot detecting unit 31 and the ligneous parts around the knot. For example, when creating image data of the outer surface and/or the inner surface of the blank piece 20, light is irradiated from the opposite side, i.e., from the inner surface and/or the outer surface, and it is therefore also possible to allow the knot detecting unit 31 to have a function of determining whether the irradiated light passes. Furthermore, a person can visually determine the presence of a gap between the knot and the ligneous parts around the knot and input the determination result to the simulation apparatus 201. If a person visually determines whether a gap is present, the simulation apparatus 201 performs, at Step S14, a process and the subsequent processes in accordance with the determination result related to the presence of the gap that is input via the input unit 2.

After Step S15, in accordance with the estimation results performed by the knot shape estimating unit 61, the cutting mode determining unit 62 determines the cutting location and the cutting shape of the blank piece 20 to be cut (Step S16). At this stage, the cutting mode determining unit 62 determines the cutting location and the cutting shape in such a manner that the cutting location includes at least a part of the knot and that the thickness of the knot is substantially the same as that of the compressed blank piece 20.

Figure 27:
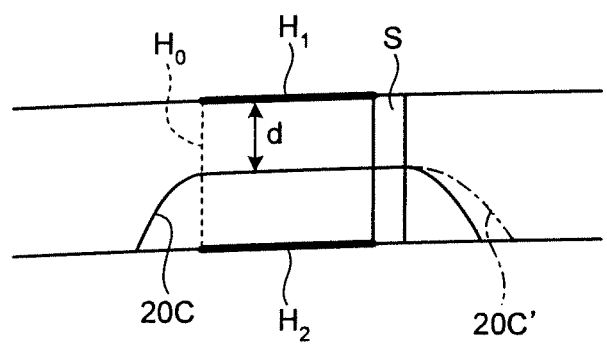
FIG. 27 is a sectional view illustrating a part of the cutting shape determined by a cutting mode determining unit in the simulation apparatus according to the second embodiment of the present invention.
Figure 28:
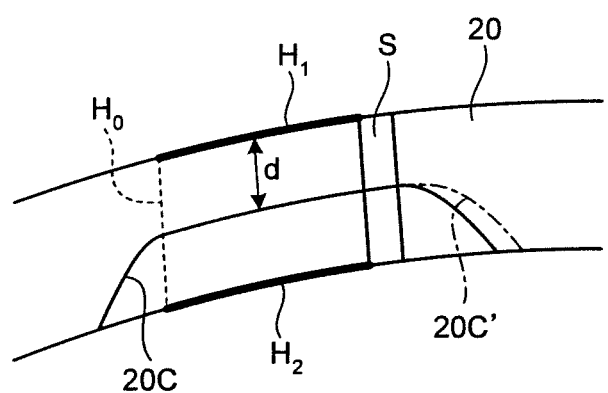
FIG. 28 is a sectional view illustrating the cutting shape in the direction orthogonal to that illustrated in FIG. 27.

FIGS. 27 and 28 are schematic diagrams each illustrating the cutting shape determined by the cutting mode determining unit 62. The cutting surfaces illustrated in FIGS. 27 and 28 correspond to those illustrated in FIGS. 25 and 26. As illustrated in FIGS. 27 and 28, the cutting shape determined by a cutting surface 20C has a concave shape that includes a bottom surface including the cross section of the knot $H_0$ estimated by the knot shape estimating unit 61 and that has an opening whose area is greater than that of the bottom surface. A columnar region, which extends in the thickness direction of the blank piece 20 from the edge of the bottom surface as the outer edge of the columnar region, does not intersect with the cutting surface 20C other than the bottom surface. The thickness d of the knot $H_0$, which is a thickness other than that of the cutting location, is set to a value substantially the same as the thickness of the compressed blank piece 20.

In FIGS. 27 and 28, a cutting surface 20C' indicated by the dashed line indicates a cutting surface that is set when the gap S is also occupied by the knot. When the gap S is present in this way, the volume of the cutting location is smaller by an amount substantially equal to the volume of the gap S when compared with a case in which the shape of the knots are the same and a gap is not present. In FIGS. 27 and 28, the cutting surface 20C on the side that does not have the gap S is not changed, which is the same state as the cutting surface 20C'; however, this case is merely an example. In other words, the cutting location or the cutting shape vary in accordance with the location of the knot or the volume of the gap.

According to the second embodiment of the present invention, the cutting location and the cutting shape are determined in such a manner that the cutting location includes at least a part of the knot and that the thickness of the knot is substantially the thickness of the compressed blank piece 20. When performing the compression molding on the blank piece 20, there is hardly any chance of flowing the component of the blank piece 20 other than the knot $H_0$ into the thickness direction of the knot $H_0$. Accordingly, when compressing the blank piece 20, it is possible to prevent the occurrence of a failure, such as cracking or buckling, caused by an excessive compressive force being applied to the knot $H_0$. Furthermore, because the cutting surface is determined in such a manner that only the inner surface of the blank piece 20 is cut, the thickness of the cutting can be easily adjusted, and moreover, the external appearance of the outer surface is not affected.

Furthermore, according to the second embodiment of the present invention, in order to fill the gap S between the knot and the ligneous parts around the knot, the simulation apparatus 201 has a function of reducing the amount of cutting when compared with a case in which the gap S is not present. Accordingly, even when a blank piece has a gap, the simulation apparatus 201 can determine an appropriate cutting mode.

After Step S16, the simulation image creating unit 32 creates a simulation image that indicates the cutting location and the cutting shape determined by the cutting mode determining unit 62 (Step S17). Then, the display unit 4 displays the created simulation image (Step S18).

Figure 29:
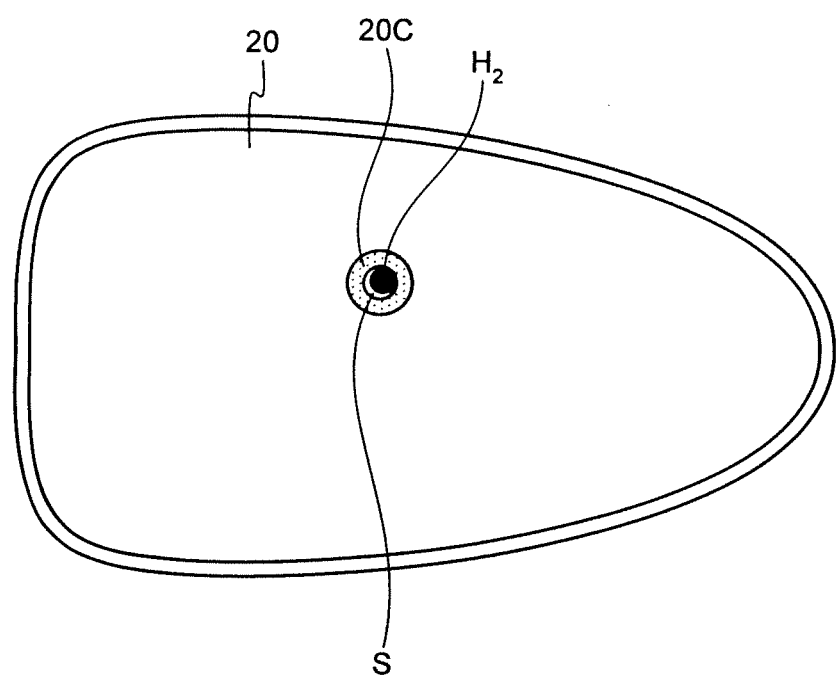
FIG. 29 is a schematic diagram illustrating an example of a simulation image of an inner surface of the blank piece displayed using the simulation method according to the second embodiment of the present invention.
Figure 30:
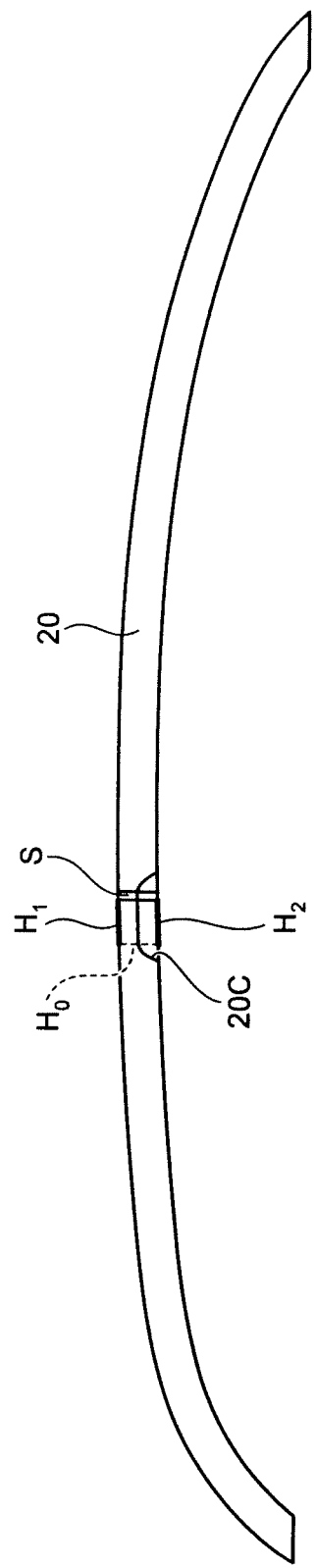
FIG. 30 is a schematic diagram illustrating an example of simulation image of the cross section of the blank piece displayed using the simulation method according to the second embodiment of the present invention.
Figure 31:
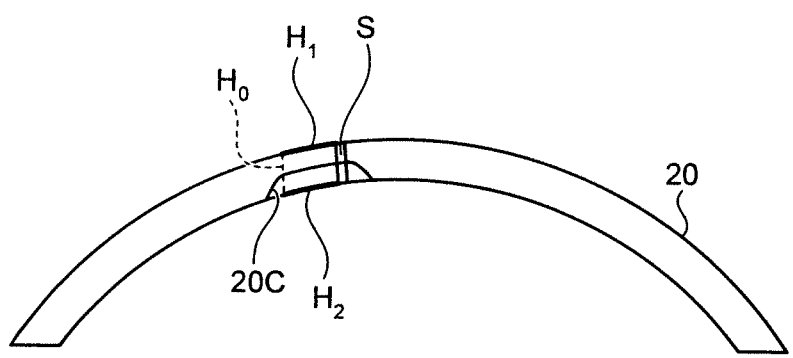
FIG. 31 is a schematic diagram illustrating an example of simulation image of the cross section of the blank piece in the direction orthogonal to that illustrated in FIG. 30.

FIGS. 29 to 31 are schematic diagrams each illustrating an example of a simulation image displayed by the display unit 4. FIGS. 29 to 31 correspond to the examples of the simulation images illustrated in FIGS. 23 to 25, respectively. The simulation image creating unit 32 can create a simulation image of any given cut surface. The cut surface can be displayed on the display unit 4 by selecting simulation images using the input unit 2. Furthermore, the display unit 4 can also display an enlarged view of the cutting surface 20C as illustrated in FIGS. 27 and 28.

After displaying the simulation image, the simulation apparatus 201 ends the series of processes. When performing the same process on a plurality of image data, the same process can be performed on other image data by returning to Step S11 after Step S18.

In the following, a case will be described in which the knot detecting unit 31 does not detect a knot at Step S12 (No at Step S12). In such a case, the display unit 4 displays information indicating that the cutting is not required (Step S19). Then, the simulation apparatus 201 ends the series of processes.

The method for forming the blank piece 20 in which the cutting mode is simulated in a manner described above is the same method for molding the blank piece 10 described in the first embodiment. The compressed wooden piece obtained by this forming method is in close contact with the ligneous parts around a knot regardless of the state of the knot before the compression. Accordingly, even if a gap is present between the knot before the compression and the ligneous parts around the knot, there is no possibility of the knot coming out from the compressed wooden piece.

According to the second embodiment of the present invention described above, image data stored in the storing unit is read; a knot appearing on the front surface of a blank piece is detected by performing image recognition using the read image data; when a knot is detected, the shape of the knot is estimated by referring to shape information on the blank piece stored in the storing unit; and the cutting location and the cutting shape of the blank piece are determined, in accordance with the estimation results, in such a manner that the cutting location and the cutting shape include a part of the knot and that the thickness of the knot is substantially the same as that of the compressed blank piece. Accordingly, when compressing a blank piece that has a knot, it is possible to enhance the cutting of the blank piece into the shape in which a compressive force is hardly applied to the knot of the blank piece. Therefore, it is possible to appropriately perform the compression forming on a wooden piece even when the wooden piece has a knot and to improve yields.

Furthermore, according to the second embodiment of the present invention, when a gap is present between a knot and the ligneous parts around the knot, the cutting location and the cutting shape of the blank piece is determined so as to fill the gap. Accordingly, it is possible to perform appropriate compression forming in accordance with various types of knots included in the wooden piece.

In the above explanation, the embodiment of the present invention has been described; however, the present invention is not limited to the two embodiments described above. For example, when the knot detecting unit detects a knot, it is also possible to use a region splitting method using edge extraction or use an image recognition method, such as a statistical pattern recognition method based on a cluster analysis.

According to an aspect of the present invention, image data stored in a storing unit is read; a knot appearing on the surface of a blank piece is detected by performing image recognition using the read image data; when a knot is detected, the shape of the knot is estimated by referring to shape information on the blank piece stored in the storing unit; and the cutting location and the cutting shape of the blank piece is determined, in accordance with the estimation results, in such a manner that the cutting location and the cutting shape include a part of the knot and the thickness of the knot is substantially the same as that of the compressed blank piece. Accordingly, when compressing the blank piece that has a knot, it is possible to enhance the cutting of the blank piece into a shape in which a compressive force is hardly applied to the knot of the blank piece. Therefore, this makes it possible to appropriately perform the compression forming on a wooden piece even when the wooden piece has a knot and to improve yields.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A simulation method of selecting a location on a wooden piece to be cut before the wooden piece is compressed, the selecting being performed as a simulation by a computer, the simulation method comprising:
    reading image data stored in a storing unit of the computer and detecting a knot appearing on a surface of a blank piece by performing image recognition using the read image data, the storing unit storing therein information related to a shape of the blank piece to be cut put from raw wood, information related to a final shape of the wooden piece obtained by compressing the blank piece, and image data obtained by capturing an image of the surface of the blank piece cut put from the raw wood;
    estimating, if a knot is detected at the detecting, a shape of the knot by referring to shape information on the blank piece stored in the storing unit; and
    determining, in accordance with the shape of the knot estimated at the estimating, a cutting location and a cutting shape of the blank piece in such a manner that the cutting location and the cutting shape include a part of the knot and a thickness of the knot is substantially the same as that of the blank piece that has been compressed.

2. The simulation method according to claim 1, wherein the blank piece has substantially a bowl shape, and
    the cutting location is arranged, at the cutting, on an inner surface of the blank piece.

3. The simulation method according to claim 1, wherein the cutting shape is a concave shape that includes a bottom surface having a cross section of the knot estimated at the estimating, an opening whose area is greater than that of the bottom surface, and a columnar region that extends substantially along a thickness direction of the blank piece from an edge of the bottom surface as an outer edge of the columnar region and that does not intersect with a cutting surface other than the bottom surface.

4. The simulation method according to claim 1, further comprising estimating a volume of a gap if the gap is present between the knot estimated at the knot shape estimating and ligneous parts around the knot, wherein a shape of the cutting location is determined at the cutting by referring to the volume of the gap estimated at the gap volume estimating.

5. The simulation method according to claim 1, further comprising:
    creating a simulation image that is displayed as a simulation and that is an image of the cutting location and the cutting shape determined at the cutting; and
    displaying the simulation image created at the creating.

6. The simulation method according to claim 2, wherein the cutting shape is a concave shape that includes a bottom surface having a cross section of the knot estimated at the estimating, an opening whose area is greater than that of the bottom surface, and a columnar region that extends substantially along a thickness direction of the blank piece from an edge of the bottom surface as an outer edge of the columnar region and that does not intersect with a cutting surface other than the bottom surface.

7. The simulation method according to claim 6, further comprising estimating a volume of a gap if the gap is present between the knot estimated at the knot shape estimating and ligneous parts around the knot, wherein a shape of the cutting location is determined at the cutting by referring to the volume of the gap estimated at the gap volume estimating.

8. The simulation method according to claim 7, further comprising:
    creating a simulation image that is displayed as a simulation and that is an image of the cutting location and the cutting shape determined at the cutting; and
    displaying the simulation image created at the creating.

9. The simulation method according to claim 3, further comprising estimating a volume of a gap if the gap is present between the knot estimated at the knot shape estimating and ligneous parts around the knot, wherein a shape of the cutting location is determined at the cutting by referring to the volume of the gap estimated at the gap volume estimating.

10. The simulation method according to claim 9, further comprising:
    creating a simulation image that is displayed as a simulation and that is an image of the cutting location and the cutting shape determined at the cutting; and
    displaying the simulation image created at the creating.

11. The simulation method according to claim 4, further comprising:
    creating a simulation image that is displayed as a simulation and that is an image of the cutting location and the cutting shape determined at the cutting; and
    displaying the simulation image created at the creating.

12. A simulation apparatus comprising:
    a storing unit that stores therein information related to a shape of a blank piece to be cut out from raw wood, information related to a final shape of a wooden piece obtained by compressing the blank piece, and image data obtained by capturing an image of a surface of the blank piece cut out from the raw wood;
    a knot detecting unit that reads the image data stored in the storing unit and that detects a knot appearing on the surface of the blank piece by performing image recognition using the read image data;
    a knot shape estimating unit that estimates a shape of the knot detected by the knot detecting unit by referring to shape information on the blank piece stored in the storing unit; and
    a cutting mode determining unit that determines, in accordance with the shape of the knot estimated by the knot shape estimating unit, a cutting location and a cutting shape of the blank piece in such a manner that the cutting location and the cutting shape include a part of the knot and a thickness of the knot is substantially the same as that of the blank piece that has been compressed.

13. The simulation apparatus according to claim 12, wherein
    the blank piece has substantially a bowl shape, and
    the cutting mode determining unit arranges the cutting location on an inner surface of the blank piece.

14. The simulation apparatus according to claim 12, wherein the cutting shape is a concave shape that includes a bottom surface having a cross section of the knot estimated by the knot shape estimating unit, an opening whose area is greater than that of the bottom surface, and a columnar region that extends substantially along a thickness direction of the blank piece from an edge of the bottom surface as an outer edge of the columnar region and that does not intersect with a cutting surface other than the bottom surface.

15. The simulation apparatus according to claim 12, further comprising a gap volume estimating unit that estimates a volume of a gap if the gap is present between the knot estimated by the knot shape estimating unit and ligneous parts around the knot, wherein the cutting mode determining unit determines a shape of the cutting location by referring to the volume of the gap estimated by the gap volume estimating unit.

16. The simulation apparatus according to claim 12, further comprising:

a simulation image creating unit that creates a simulation image that is displayed as a simulation and that is an image of the cutting location and the cutting shape determined by the cutting mode determining unit; and a displaying unit that displays the simulation image created by the simulation image creating unit.

17. The simulation apparatus according to claim 13, wherein the cutting shape is a concave shape that includes a bottom surface having a cross section of the knot estimated by the knot shape estimating unit, an opening whose area is greater than that of the bottom surface, and a columnar region that extends substantially along a thickness direction of the blank piece from an edge of the bottom surface as an outer edge of the columnar region and that does not intersect with a cutting surface other than the bottom surface.

18. The simulation apparatus according to claim 17, further comprising a gap volume estimating unit that estimates a volume of a gap if the gap is present between the knot estimated by the knot shape estimating unit and ligneous parts around the knot, wherein the cutting mode determining unit determines a shape of the cutting location by referring to the volume of the gap estimated by the gap volume estimating unit.

19. The simulation apparatus according to claim 18, further comprising:

a simulation image creating unit that creates a simulation image that is displayed as a simulation and that is an image of the cutting location and the cutting shape determined by the cutting mode determining unit; and a displaying unit that displays the simulation image created by the simulation image creating unit.

20. The simulation apparatus according to claim 14, further comprising a gap volume estimating unit that estimates a volume of a gap if the gap is present between the knot estimated by the knot shape estimating unit and ligneous parts around the knot, wherein the cutting mode determining unit determines a shape of the cutting location by referring to the volume of the gap estimated by the gap volume estimating unit.

21. The simulation apparatus according to claim 20, further comprising:

a simulation image creating unit that creates a simulation image that is displayed as a simulation and that is an image of the cutting location and the cutting shape determined by the cutting mode determining unit; and a displaying unit that displays the simulation image created by the simulation image creating unit.

22. The simulation apparatus according to claim 15, further comprising:

a simulation image creating unit that creates a simulation image that is displayed as a simulation and that is an image of the cutting location and the cutting shape determined by the cutting mode determining unit; and a displaying unit that displays the simulation image created by the simulation image creating unit.

23. A non-transitory computer-readable storage medium with an executable program stored thereon, wherein the program is for selecting a location on a wooden piece to be cut before the wooden piece is compressed and instructs a processor to perform:

reading image data stored in a storing unit and detecting a knot appearing on a surface of a blank piece by performing image recognition using the read image data, the storing unit storing therein information related to a shape of the blank piece to be cut put from raw wood, information related to a final shape of the wooden piece obtained by compressing the blank piece, and image data obtained by capturing an image of the surface of the blank piece cut put from the raw wood;

estimating, if a knot is detected at the detecting, a shape of the knot by referring to shape information on the blank piece stored in the storing unit; and determining, in accordance with the shape of a knot estimated at the estimating, a cutting location and a cutting shape of the blank piece in such a manner that the cutting location and the cutting shape include a part of the knot and a thickness of the knot is substantially the same as that of the blank piece that has been compressed.

* * * * *